United States Patent
Zhang

(10) Patent No.: US 10,316,402 B2
(45) Date of Patent: Jun. 11, 2019

(54) CRUCIBLE AND VACUUM EVAPORATION DEVICE

(71) Applicant: BOE TECHNOLOGY GROUP CO., LTD., Beijing (CN)

(72) Inventor: Yongfeng Zhang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 375 days.

(21) Appl. No.: 15/138,851

(22) Filed: Apr. 26, 2016

(65) Prior Publication Data

US 2017/0067145 A1    Mar. 9, 2017

(30) Foreign Application Priority Data

Sep. 7, 2015   (CN) .......................... 2015 1 0564844

(51) Int. Cl.
*C23C 14/24*    (2006.01)
*C23C 14/14*    (2006.01)

(52) U.S. Cl.
CPC .................................. *C23C 14/243* (2013.01)

(58) Field of Classification Search
CPC ... C23C 14/243; C23C 14/14; C23C 16/4481; C03B 5/0272; C03B 5/08; C03B 5/0334; C03B 15/10
USPC ......... 392/389, 403; 118/726; 432/156, 262, 432/264
See application file for complete search history.

(56) References Cited

U.S. PATENT DOCUMENTS

| | | | | |
|---|---|---|---|---|
| 2,465,283 A | * | 3/1949 | Schlehr | C03B 37/091 137/392 |
| 2013/0095243 A1 | * | 4/2013 | Han | C22B 34/1272 427/250 |

FOREIGN PATENT DOCUMENTS

| | | |
|---|---|---|
| CN | 102071398 A | 5/2011 |
| CN | 104278239 A | 1/2015 |
| CN | 204356396 U | 5/2015 |
| CN | 104785309 A | 7/2015 |
| JP | 02124794 A | 5/1990 |

OTHER PUBLICATIONS

Third Chinese Office Action, for Chinese Patent Application No. 2015105648443, dated Jan. 11, 2017, 11 pages.
(Continued)

*Primary Examiner* — Dana Ross
*Assistant Examiner* — James F Sims, III
(74) *Attorney, Agent, or Firm* — Kinney & Lange, P.A.

(57) ABSTRACT

A crucible, a vacuum evaporation device and a vacuum evaporation system are disclosed. In one embodiment, the crucible includes a crucible body for accommodating an evaporation material therein, a nozzle disposed at a mouth of the crucible body, and a holding groove formed at the outer circumference of the nozzle and configured for accommodating the evaporation material overflowed from the nozzle therein, so that, the overflowed evaporation material (especially aluminum material) is prevented from falling into an interior of a heating source, avoiding damage to a heating element due to a short circuit, and meanwhile, condition of overflow of the evaporation material will be checked easily by observing the holding groove. The crucible according to some embodiments adopts a structural design with a large bottom and small mouth, improving heating area and evaporation rate of the evaporation material.

5 Claims, 4 Drawing Sheets

(56) References Cited

OTHER PUBLICATIONS

Chinese Search Report dated Jan. 25, 2016, for corresponding Chinese Application No. 201510564844.3.
First Chinese Office Action, for Chinese Patent Application No. 2015105648443, dated Apr. 22, 2016, 14 pages.
Second Chinese Office Action, for Chinese Patent Application No. 2015105648443, dated Aug. 30, 2016, 12 pages.

* cited by examiner

CRUCIBLE AND VACUUM EVAPORATION DEVICE

CROSS-REFERENCE TO RELATED APPLICATION

This application claims the benefit of Chinese Patent Application No. 201510564844.3 filed on Sep. 7, 2015 in the State Intellectual Property Office of China, the whole disclosure of which is incorporated herein by reference.

BACKGROUND

1. Technical Field

The disclosure relates to the field of display technology, and particularly to a crucible, a vacuum evaporation device and a vacuum evaporation system.

2. Description of the Related Art

At present, when manufacturing an OLED device, metal or alloy having active property is usually adopted to manufacture a metal cathode of the OLED device, while conductive transparent indium tin oxide (ITO) or tin oxide ($SnO_2$) material is adopted to manufacture an anode of the OLED device. As to the material for cathode, it should have a relatively lower electron escape energy (namely, a lower work function), in order for injecting electrons into an organic layer; while, as to the material for anode, it should have a relatively greater work function, in order for injecting holes into organic layers including a hole injection layer, a hole transportation layer and the like. Specifically, metal having active property, such as magnesium aluminum alloy, aluminum or the like, is used as the material for cathode. Normally, the metallic material for cathode is required to be formed as a film on a surface of a substrate by using a vacuum evaporation device. In case that aluminum metal is adopted as the metallic material for cathode, since there is a relatively lower vapour pressure at the melting point of aluminum metal, the temperature under which the evaporation process is implemented is set to be higher than the aluminum metal's melting point (660° C.) where the aluminum metal is in a melting state. At this point, it is common that the molten aluminum metal material creeps along an inner wall of the crucible, which is the so-called upward "creepage phenomenon", and finally overflows from the top of the crucible, resulting in damage to the heating source.

SUMMARY

Accordingly, according to a first aspect of the disclosure, there is provided a crucible, comprising a crucible body for accommodating an evaporation material therein, a nozzle disposed at a mouth of the crucible body, and, a holding groove formed at the outer circumference of the nozzle and for accommodating the evaporation material overflowed from the nozzle therein.

According to a second aspect of the disclosure, there is further provided a vacuum evaporation device, comprising: the abovementioned crucible, and a heating source for heating the crucible.

According to a third aspect of the disclosure, there is also provided a vacuum evaporation system, comprising the abovementioned vacuum evaporation device.

where, 1—crucible body; 2—nozzle; 3—holding tank; 4—barrier; 11—upper chamber; 12—lower chamber; 20—heating source; 21—heating chamber; and 22—heater.

DETAILED DESCRIPTION OF THE EMBODIMENTS

The disclosure will be further described hereinafter in detail in conjunction with preferred embodiments and with reference to the attached drawings. These embodiments are used for explanation and illustration purposes, but not to limit the invention.

In this disclosure, it should be noted that, unless otherwise specified and defined definitely, "a/the plurality of" represents two or more than two; and, orientations or positional relationships denoted by terminologies "upper", "lower", "left", "right", "inner", "outer", "front", "rear", "top", "bottom" and the likes are those shown in the figures, and only intended for easing or simplifying the description of these embodiments, instead of expressing or implying that the devices or elements should be located at specific orientations or should be configured or manipulated at specific orientations, accordingly, they are not intended to limit the scope of the present invention. In addition, terminologies "first", "second", "third" and the likes are used for explanation and illustration purposes, instead of expressing or implying order of precedence.

In this disclosure, it should be noted that, unless otherwise specified and defined definitely, terminologies "mount", "connect to", "connect with" and the likes should be explained and illustrated in a broad sense, for example, it may be a fixed connection, or a detachable connection, or an integrated connection; or, it may also be a mechanical connection or an electrical connection; or else, it may be a direct connection or an indirect connection with an intermediate agency. For those skilled in the art, the above terminologies can be explained and illustrated in specific situations in the disclosure.

First Embodiment

Figure 1:
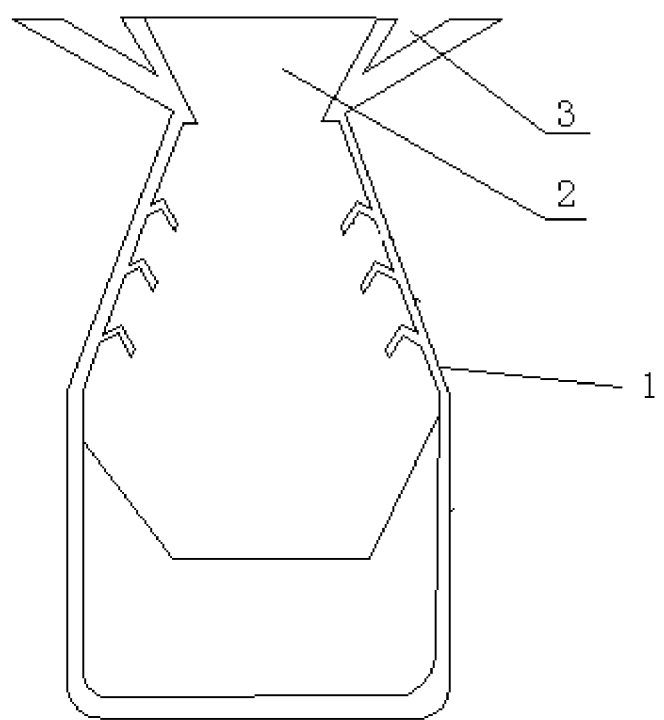
FIG. 1 is a schematic structural view of a crucible according to a first embodiment of the disclosure.

Referring to FIG. 1, a crucible according to the first embodiment comprises a crucible body 1 for accommodating an evaporation material (a metal cathode material, e.g., aluminum material) therein, a nozzle 2 disposed at a mouth of the crucible body 1, and, a holding groove 3 formed at the outer circumference of the nozzle 2 and configured for accommodating the evaporation material overflowed from the nozzle 2 therein. So that, the overflowed evaporation material (especially, aluminum material) is prevented from falling into interior of a heating source (namely a heating apparatus provided outside the crucible), avoiding damage to a heating element due to a short circuit. Moreover, the holding groove 3 is designed in such a manner that it is easy to check a condition of overflow of the evaporation material and whether or not it needs to repair the crucible.

It should be noted that, in the crucible according to the first embodiment, where the holding groove 3 is formed, shapes of the crucible body 1 and the nozzle 2 are not particularly limited and can be set freely in accordance with practical requirements. For example, the nozzle 2 is shaped to be expanded from bottom to top, that is, a lower opening of the nozzle 2 has a smaller diameter than an upper opening of the nozzle, so as to obtain an effect of slowing a creeping speed of the molten evaporation material and thus reducing overflow of the molten evaporation material.

Correspondingly, shape and construction of the holding groove 3 may be achieved in various manners. For example, the holding groove 3 is defined by surrounding an outer wall of the nozzle 2 with a connection side wall and connecting one end of the connection side wall to the bottom of the nozzle 2 along the outer circumference of the nozzle. As a result, a wedge-shaped holding groove 3 is formed between the outer wall of the nozzle 2 and the connection side wall. The holding groove 3 is simple in structure and has good universality.

Second Embodiment

Technical contents of the second embodiment which are the same as those of the first embodiment are omitted to avoid duplicating description, although such technical contents of the first embodiment can be employed in the second embodiment. The second embodiment is implemented based on a further modification of the first embodiment, in which the crucible according to this embodiment adopts a structural design with "large bottom and small mouth".

Figure 2:
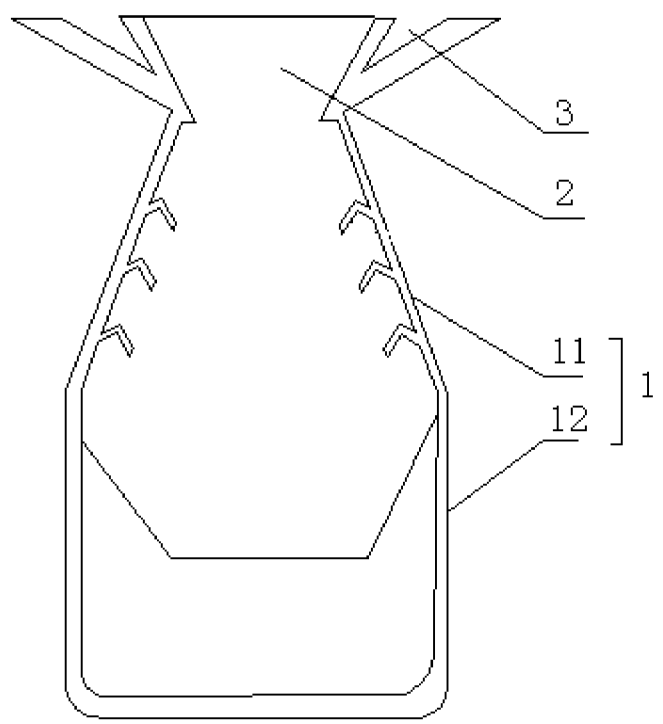
FIG. 2 is a schematic structural view of a crucible according to a second embodiment of the disclosure.

Referring to FIG. 2, the crucible body 1 further comprises an upper chamber 11 and a lower chamber 12 communicated with each other. The lower chamber 12 is used for accommodating the evaporation material therein and has an internal diameter greater than an internal diameter of the upper chamber 11. The upper chamber 11 is shaped to be contracted from bottom to top, and, a top of the upper chamber is formed with the mouth. To facilitate the manufacture, the upper chamber 11 may be shaped to be a conical chamber with a mouth, while the lower chamber 12 may be shaped to a cylindrical-like chamber.

Of course, this crucible, which adopts the structural design with "large bottom and small mouth", may be used either in cooperation with the holding groove 3 or independently, in order for improving heating area and evaporation rate of the evaporation material.

Third Embodiment

Figure 3:
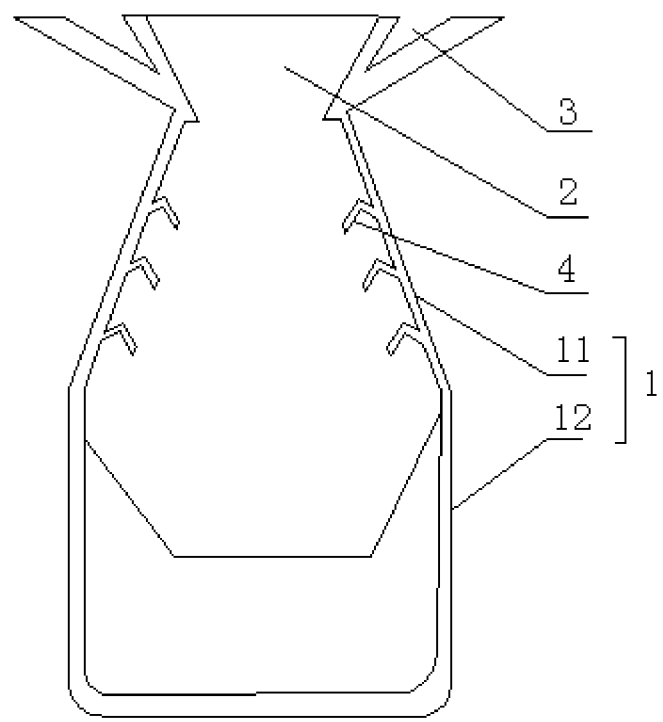
FIG. 3 is a schematic structural view of a crucible according to a third embodiment of the disclosure.

Technical contents of the third embodiment which are the same as those of the second embodiment are omitted to avoid duplicating description, although such technical contents of the second embodiment can be employed in the third embodiment. The third embodiment is implemented based on a further modification of the second embodiment. Referring to FIG. 3, at its upper part, the crucible is further provided with a baffle 4 structure, to slow a creeping speed of the molten evaporation material along inner wall of the crucible.

Specifically, a plurality of baffles 4 are formed around an inner wall of the upper chamber 11 of the crucible. That is, each baffle 4 is distributed annularly on the inner wall of the upper chamber 11, and the number of the baffles may be set freely. For example, there are three baffles 4 provided at an interval.

Preferably, the baffle 4 is made of a material that is not infiltrated by molten aluminum, such as, zirconium oxide and the like.

In addition, the baffle 4 comprises an inclined section and a bent section, one end of the inclined section is formed around the inner wall of the upper chamber 11 while the other end is extended upwardly at an angle and is connected to one end of the bent section, and, the other end of the bent section is extended downwardly. As a result, the baffle 4 is in a bend manner, which facilitates to slow a creeping speed of the molten evaporation material along the inner wall of the crucible.

Fourth Embodiment

The fourth embodiment relates to a vacuum evaporation device comprising the crucible of any of the above embodiments, and a heating source for heating the crucible. Of course, with addition of the holding groove to the crucible, i.e., the holding groove is formed at the outer circumference of the nozzle and is used for accommodating the evaporation material overflowed from the nozzle therein, the overflowed evaporation material is prevented from falling into interior of the heating source, avoiding damage to a heating element due to a short circuit.

Figure 4:
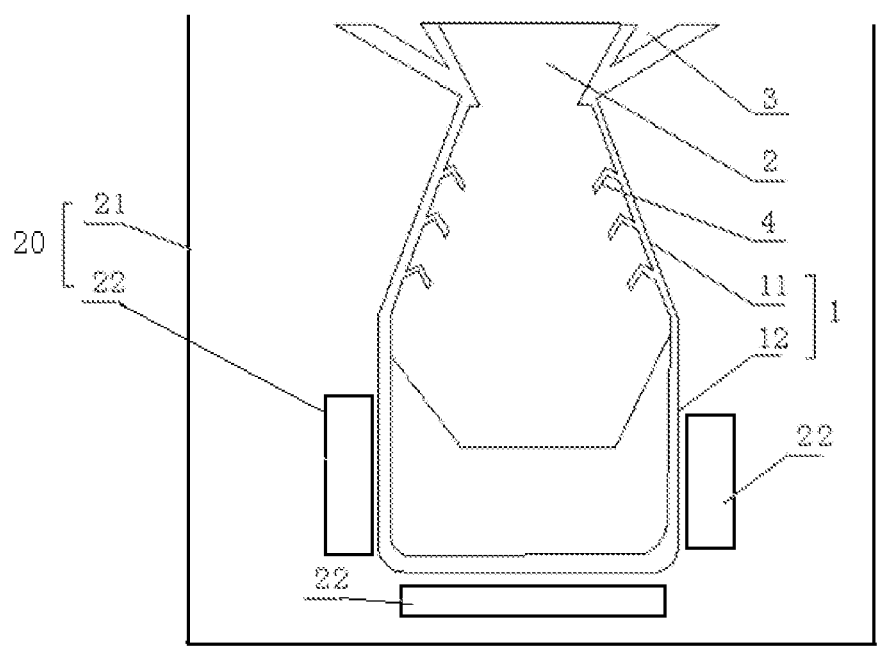
FIG. 4 is a schematic structural view of a vacuum evaporation device according to a fourth embodiment of the disclosure.

Specifically, referring to FIG. 4, the heating source 20 comprises a heating chamber 21 provided outside the crucible and a heater 22 provided between the crucible and the heating chamber 22. The holding groove 4 is provided above the heater 22, preventing the heater 22 from being damaged by the evaporation material overflowed from the nozzle 2.

Fifth Embodiment

The fifth embodiment relates to a vacuum evaporation system comprising the vacuum evaporation device according to the above embodiment. The vacuum evaporation system is used to manufacture an OLED device, and may be the same as a conventional evaporation system. For example, this system further comprises a control mechanism, and a sensing mechanism for sensing temperature or evaporation rate within the crucible, and feeding back them to the control mechanism for automatic controlling.

Concerning the above, in the crucible, the vacuum evaporation device and the vacuum evaporation system according to these embodiments, the holding groove is formed at the outer circumference of the nozzle and is configured for accommodating the evaporation material (especially, aluminum material) overflowed from the nozzle therein, so that, the overflowed evaporation material is prevented from falling into interior of the heating source, avoiding damage to a heating element due to a short circuit, and meanwhile, condition of overflow of the evaporation material will be checked easily. Moreover, the crucible according to these embodiments may adopt a structural design with "large bottom and small mouth", improving heating area and evaporation rate of the evaporation material. In addition, the baffle structure is provided inside the crucible, to slow a creeping speed of the molten evaporation material along the inner wall of the crucible. Accordingly, the crucible, the vacuum evaporation device and the vacuum evaporation system according to these embodiments solve the problem of damaging the equipment since, during evaporation, the evaporation material under a molten state is prone to creep along the inner wall of the crucible and finally overflows from the crucible and falls into interior of the heating source.

These embodiments are provided for explanation and illustration purposes, are not exhaustive, and should not be construed as being limited to the description set forth herein. It is obvious for those skilled in the art that various modifications and changes may be made. Selections and depictions of these embodiments intend to reveal principles and actual applications of the present disclosure in a better manner, so that those skilled in the art will understand the present disclosure and thus make various embodiments suitable for specific uses with various modifications.

Although several exemplary embodiments have been shown and described, it would be appreciated by those skilled in the art that various changes or modifications may be made in these embodiments without departing from the principles and spirit of the present invention, the scope of which is defined in the claims and their equivalents.

What is claimed is:

1. A crucible, comprising:
    a crucible body for accommodating an evaporation material therein,
    a nozzle disposed at a mouth of the crucible body, and
    a holding groove formed at the outer circumference of the nozzle and configured for accommodating the evaporation material overflowed from the nozzle therein;
    wherein the crucible body comprises an upper chamber and a lower chamber communicated with each other; and
    wherein a plurality of baffles are attached to an inner wall of the upper chamber;
    wherein each of the baffles comprises an inclined section and a bent section, one end of the inclined section is extended from the inner wall of the upper chamber while the other end of the inclined section is extended upwardly at an angle and is connected to one end of the bent section, and the other end of the bent section is extended downwardly; and
    wherein the crucible body is configured in such a way that the upper chamber tapers from the lower chamber to the nozzle such that a connection of the upper chamber and the lower chamber has a larger diameter than a connection of the upper chamber and the nozzle.

2. The crucible of claim 1, wherein each of the baffles is made of a material that is not infiltrated by molten aluminum.

3. The crucible of claim 1, wherein the holding groove is defined by surrounding an outer wall of the nozzle with a connection side wall and connecting one end of the connection side wall to the bottom of the nozzle along the outer circumference of the nozzle.

4. A vacuum evaporation device, comprising: the crucible of claim 1, and a heating source for heating the crucible.

5. The vacuum evaporation device of claim 4, wherein the heating source comprises a heating chamber provided outside the crucible and a heater provided between the crucible and the heating chamber.

* * * * *